United States Patent (10) Patent No.: US 7,990,193 B2
Lee et al. (45) Date of Patent: Aug. 2, 2011

(54) SEMICONDUCTOR INTEGRATED CIRCUIT AND METHOD OF CONTROLLING THE SAME

(75) Inventors: Hyun Woo Lee, Ichon-si (KR); Won Joo Yun, Ichon-si (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 73 days.

(21) Appl. No.: 12/493,756

(22) Filed: Jun. 29, 2009

(65) Prior Publication Data

US 2010/0264966 A1 Oct. 21, 2010

(30) Foreign Application Priority Data

Apr. 15, 2009 (KR) .................. 10-2009-0032670

(51) Int. Cl.
*H03L 7/06* (2006.01)
(52) U.S. Cl. ........................................ 327/158; 327/149
(58) Field of Classification Search .................. 327/149, 327/158
See application file for complete search history.

(56) References Cited

U.S. PATENT DOCUMENTS

| | | | | |
|---|---|---|---|---|
| 5,990,730 A * | 11/1999 | Shinozaki | ...................... | 327/544 |
| 6,437,619 B2 * | 8/2002 | Okuda et al. | .................. | 327/158 |
| 6,525,988 B2 | 2/2003 | Ryu et al. | | |
| 6,584,021 B2 * | 6/2003 | Heyne et al. | .................. | 365/194 |
| 6,836,437 B2 | 12/2004 | Li et al. | | |
| 7,348,819 B2 * | 3/2008 | Choi | .............................. | 327/158 |
| 7,366,862 B2 * | 4/2008 | Nystuen et al. | ................ | 711/167 |
| 7,388,415 B2 * | 6/2008 | Lee | ................................ | 327/158 |
| 7,414,447 B2 * | 8/2008 | Cho | .............................. | 327/158 |
| 7,486,119 B2 * | 2/2009 | Lee | ................................ | 327/158 |
| 7,642,823 B2 * | 1/2010 | Cho | .............................. | 327/156 |
| 7,672,191 B2 * | 3/2010 | Jang | ........................ | 365/233.12 |
| 7,737,741 B2 * | 6/2010 | Ma | ................................. | 327/158 |
| 7,821,308 B2 * | 10/2010 | You | .............................. | 327/158 |
| 2004/0212406 A1 | 10/2004 | Jung | | |
| 2006/0020835 A1 | 1/2006 | Samson et al. | | |
| 2007/0069777 A1 * | 3/2007 | Kim | .............................. | 327/158 |
| 2008/0079469 A1 * | 4/2008 | Cho | .............................. | 327/158 |
| 2008/0204095 A1 * | 8/2008 | Cho | .............................. | 327/158 |
| 2008/0272812 A1 * | 11/2008 | Cho | .............................. | 327/158 |
| 2009/0015302 A1 * | 1/2009 | You | .............................. | 327/158 |
| 2009/0115474 A1 * | 5/2009 | Lee | ................................ | 327/158 |
| 2009/0121784 A1 * | 5/2009 | Lee et al. | ...................... | 327/544 |
| 2009/0289677 A1 * | 11/2009 | Mizukane et al. | ............ | 327/158 |
| 2010/0134155 A1 * | 6/2010 | Lee et al. | ...................... | 327/143 |
| 2010/0142296 A1 * | 6/2010 | You | .............................. | 365/194 |
| 2010/0142660 A1 * | 6/2010 | Schnarr | ......................... | 375/344 |
| 2010/0164572 A1 * | 7/2010 | Kim | .............................. | 327/158 |
| 2010/0219868 A1 * | 9/2010 | Chen | ............................. | 327/158 |
| 2010/0239234 A1 * | 9/2010 | Ma | ................................. | 386/117 |

FOREIGN PATENT DOCUMENTS

| | | |
|---|---|---|
| JP | 2005-251370 A | 9/2005 |
| JP | 2007-095265 A | 4/2007 |
| JP | 2007-095283 A | 4/2007 |
| JP | 2007-097135 A | 4/2007 |
| JP | 2007-221750 A | 8/2007 |
| KR | 10-0815185 B1 | 3/2008 |

* cited by examiner

*Primary Examiner* — Lincoln Donovan
*Assistant Examiner* — Adam D Houston
(74) *Attorney, Agent, or Firm* — Ladas & Parry LLP

(57) ABSTRACT

A semiconductor integrated circuit includes an update control unit configured to generate an update control signal in response to a first command and a second command; and a DLL (Delay Locked Loop) circuit configured to generate an output clock by controlling a phase of an external clock in response to the update control signal.

25 Claims, 3 Drawing Sheets

US 7,990,193 B2

SEMICONDUCTOR INTEGRATED CIRCUIT AND METHOD OF CONTROLLING THE SAME

CROSS-REFERENCES TO RELATED PATENT APPLICATION

The present application claims priority under 35 U.S.C 119(a) to Korean Application No. 10-2009-0032670, filed on Apr. 15, 2009, in the Korean Intellectual Property Office, the disclosure of which is incorporated herein by reference in its entirety as set forth in full.

BACKGROUND

1. Technical Field

The present invention relates generally to a semiconductor integrated circuit and a method of controlling the same, and more particularly, to a semiconductor integrated circuit including a DLL (Delay Locked Loop) circuit and a method of controlling the semiconductor integrated circuit.

2. Related Art

A conventional DLL circuit is included in a semiconductor integrated circuit (IC) device to supply an internal clock signal having an earlier phase than an acquired reference clock signal by converting an external clock signal by a predetermined time. When the internal clock signal that is utilized in the semiconductor IC is delayed through a clock buffer and a transmission line to have a phase difference from the external clock signal, the DLL circuit is used to address a resultant problem in that an output data access time is extended. The DLL circuit controls a phase of the internal clock signal so that it is earlier than the external clock signal by a predetermined time in order to increase a valid data output interval.

Semiconductor integrated circuits implement a power down mode to reduce power consumption and stop power supply to each region inside the semiconductor integrated circuits when entering the power down mode. DLL circuits are also configured to reduce power consumption by stopping an operation when entering the power down mode.

Generally, DLL circuits are provided for a read operation. However, DLL circuits in the related art are configured to stop an operation only when entering the power down mode. Practically, the possibility that the phase of a clock outputted from the DLL circuit changes is high since each circuit region consumes a lot of power in is periods of frequent read operations; however, since a small amount of power is consumed in periods where read operations are intermittently performed, there is smaller possibility that a malfunction may occur due to a change in the phase of a clock. Nevertheless, the DLL circuit continuously performs updates even though the frequency of read operations is low in a semiconductor integrated circuit. That is, although a DLL circuit effectively reduces power consumption in a power down mode, it still consumes power in situations that are substantially similar to the power down mode. These operational characteristics of DLL circuits act as technical limits in reducing power consumption of a semiconductor integrated circuit.

SUMMARY

Embodiments of the present invention provide a semiconductor integrated circuit that improves power efficiency by reducing power consumption of a DLL circuit, and a method of controlling the semiconductor integrated circuit.

In one embodiment of the present invention, a semiconductor integrated circuit includes an update control unit configured to generate an update control signal in response to a first command and a second command; and a DLL circuit configured to generate an output clock by controlling a phase of an external clock in response to the update control signal.

In another embodiment of the present invention, a semiconductor integrated circuit includes a DLL circuit configured to generate an output clock by controlling a phase of an external clock; and an update control unit configured to control whether to update the DLL circuit by distinguishing a pseudo power down mode based on the frequency of which a read operation is performed.

In still another embodiment of the present invention, a method of controlling a semiconductor integrated circuit includes counting a number of times a second command is input after a first command is input; generating an update control signal according to a result of the counting; and controlling an update operation of a DLL circuit in response to the update control signal.

These and other features, aspects, and embodiments are described below in the period "Detailed Description."

BRIEF DESCRIPTION OF THE DRAWINGS

Features, aspects, and embodiments are described in conjunction with the attached drawings, in which.

DETAILED DESCRIPTION

Hereinafter, preferred embodiments will be described in detail with reference to the accompanying drawings.

Figure 1:
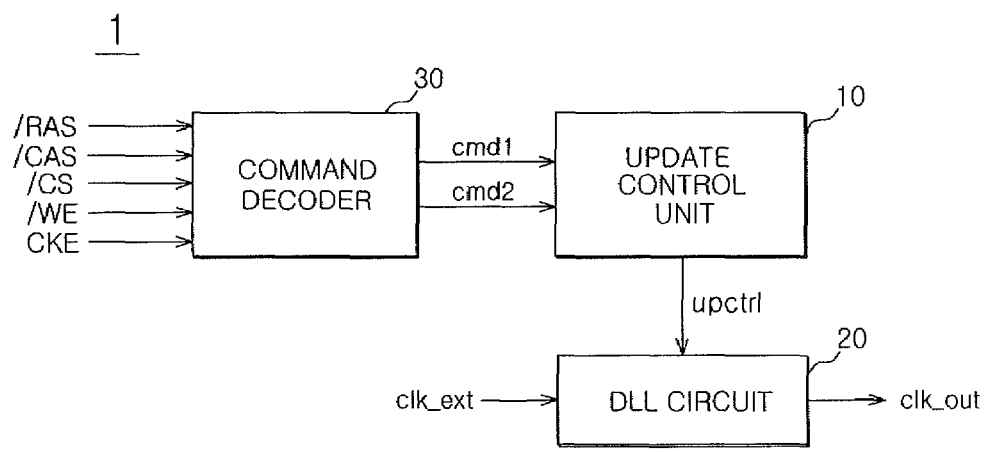
FIG. 1 is a block diagram showing a configuration of a semiconductor integrated circuit according to an embodiment of the present invention.

FIG. 1 is a block diagram showing a configuration of a semiconductor integrated circuit according to an embodiment of the present invention.

As shown in FIG. 1, a semiconductor integrated circuit 1 according to an embodiment of the present invention can include an update control unit 10, a DLL circuit 20, and a command decoder 30.

The update control unit 10 generates an update control signal 'upctrl' in response to a first command 'cmd1' and a second command 'cmd2'. The DLL circuit 20 receives the update control signal 'upctrl' and generates an output clock 'clk_out' by controlling a phase of an external clock 'clk_ext' in response to the update control signal 'upctrl'. The command decoder 30 generates the first command 'cmd1' and the second command 'cmd2' by decoding a plurality of external commands.

The first command 'cmd1' may be an auto-refresh command and the second command 'cmd2' may be a read command. In general, in a semiconductor integrated circuit, the input cycle of the auto-refresh command is longer than the input cycle of the read command. In addition, the input cycle of the read command depends on whether to perform the read operation and correspondingly is not uniform.

In this case, the update control unit 10 determines how many times the read command is input for every period between the input timings of the auto-refresh command. Further, the update control unit 10 enables the update control signal 'upctrl' when the read command is determined to have been input a predetermined number of times. The update control unit 10 disables the update control signal 'upctrl' when the read command has not been input the predetermined number of times.

Alternatively, the first command 'cmd1' may be a power down command and the second command 'cmd2' may be a read command. In general, in a semiconductor integrated circuit, the input cycle of the power down command is longer than the input cycle of the read command.

Similar to the previous case, the update control unit 10 determines how many times the read command is input for every period between the input timings of the power down command. Further, the update control unit 10 enables the update control signal 'upctrl', when the read command is determined to have been input a predetermined number of times and disables the update control signal 'upctrl' when the read command has not been input the predetermined number of times.

More simply, the update control unit 10 performs a function for distinguishing a pseudo power down mode based on the frequency of read operations performed. This is because it is not difficult to recognize that the periods where the read operation is intermittently performed are substantially similar to the power down mode, even if these periods are not the power down mode.

The DLL circuit 20 compensates for an amount of delay of the external clock 'clk_ext' using a clock buffer and a clock transmission line. The output clock "clk_out" output from the DLL circuit 20 has a phase that leads the external clock 'clk_ext' by a predetermined time.

The DLL circuit 20 can perform the update operation during the periods in which the update control signal 'upctrl' is enabled. That is, the DLL circuit 20 performs a common delay-locked operation with respect to the external clock 'clk_ext' when the semiconductor integrated circuit is not entering the power down or the pseudo power down mode. However, the DLL circuit 20 does not respond to a phase change of the external clock 'clk_ext' when entering the power down or pseudo power down mode, but does provide a locked-delay amount with respect to the external clock 'clk_ext'.

The command decoder 30 has a configuration that decodes external commands, such as /RAS, /CAS, /CS, /WE, and CKE. This configuration of the command decoder 30 is necessary for a semiconductor integrated circuit.

As described above, in a semiconductor integrated circuit 1 according to an embodiment of the present invention, the update control unit 10 determines whether the semiconductor integrated circuit is in a pseudo power down mode based on the number of read operations, and correspondingly, determines whether the DLL circuit 20 performs the update operation. Therefore, power consumption of the DLL circuit 20 is reduced in situations that are substantially similar to the power down mode, such that the semiconductor integrated circuit 1 can operate using less power.

Figure 2:
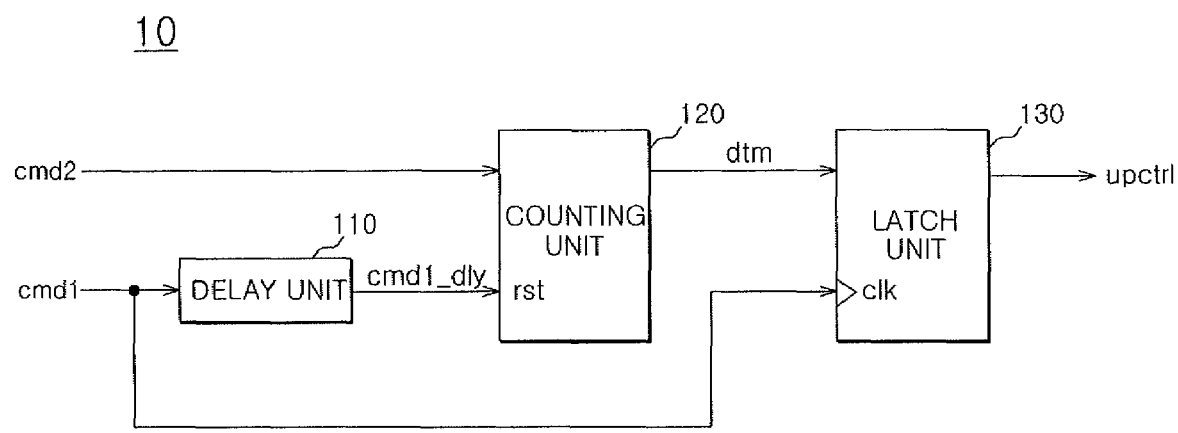
FIG. 2 is a diagram showing the update control unit shown in FIG. 1.

FIG. 2 is a diagram showing the update control unit 10 shown in FIG. 1.

As shown in FIG. 2, the update control unit 10 can include a delay unit 110, a counting unit 120, and a latch unit 130.

The delay unit 110 generates a delay command 'cmd1_dly' by delaying the first command 'cmd1'. The counting unit 120 is reset according to the delay command 'cmd1_dly' and generates a determination signal 'dtm' by performing a counting operation in response to the second command 'cmd2'. The latch unit 130 latches the determination signal 'dtm' in response to the first command 'cmd1' and outputs the update control signal 'upctrl'.

The determination signal 'dtm' output from the counting unit 120 may be the most significant bit in a plurality of bit signals generated by the counting operation of the counting unit 120. That is, the counting unit 120 is reset according to the input of the delay command 'cmd_dly', generates a signal having a plurality of bits by performing the counting operation every time the second command 'cmd2' is input, and then outputs the most significant bit as the determination signal 'dtm'. In this operation, the counting unit 110 disables the determination signal 'dtm' when the number of times the second command 'cmd2' is input to the counting unit 120 is less than the predetermined number of times. Conversely, the counting unit 110 is enables the determination signal "dtm" when the number of times the second command 'cmd2' is input to the counting unit 120 is greater than the predetermined number of times. Using a common counter circuit as described above, the number of times the second command 'cmd2' is input that is used for enabling the determination signal 'dtm' can be set according to the operational characteristics of semiconductor integrated circuits.

The delay unit 110 is provided to support the latch unit 130 in latching the determination signal "dtm". That is, when the first command 'cmd1' is input, the counting unit 120 performs the reset operation and the latch unit 130 latches the determination signal 'dtm'. Accordingly, when the counting unit 120 resets the determination signal 'dtm' before the latch unit 130 has the opportunity to latch the determination signal 'dtm', the latch unit 130 always latches the disabled determination signal 'dtm'. Therefore, the delay unit 110 prevents the counting unit 120 from being reset before the latch unit 130 has the opportunity to latch the determination signal 'dtm' by generating the delay command 'cmd1_dly' by delaying the first command 'cmd1'. The delay command 'cmd_dly' is then supplied to the counting unit 120.

The configuration of the latch unit 130 may be comprised of a common flip-flop circuit and an inverter.

Figure 3A:
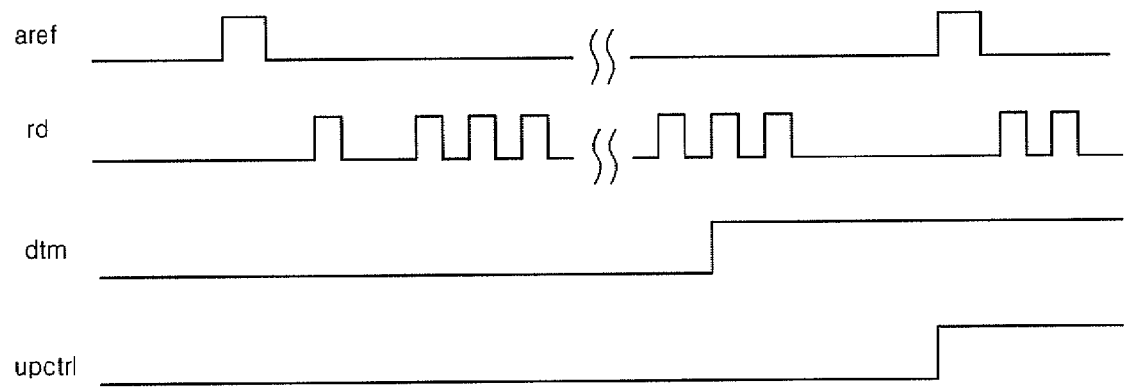
FIG. 3A and FIG. 3B are timing diagrams showing operations of the update control unit shown in FIG. 2.
Figure 3B:
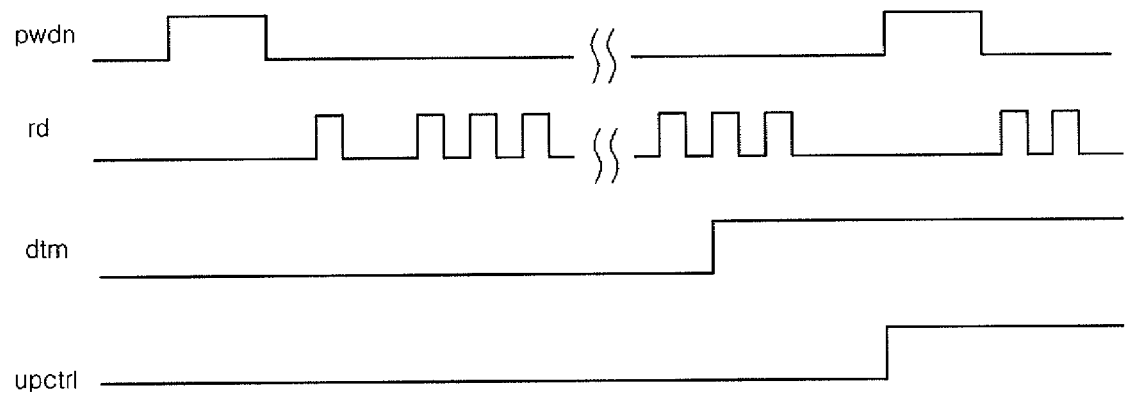

The operation of the update control unit 10 as described above can be more easily understood with reference to the timing diagrams shown FIG. 3A and FIG. 3B.

FIG. 3A and FIG. 3B are timing diagrams showing operations of the update control unit 10 shown in FIG. 2.

In the exemplary diagram of FIG. 3A, the first command 'cmd1' is represented as an auto-refresh command 'aref' and the second command "cmd2" is represented as a read command 'rd'. As shown in FIG. 3A, the read command 'rd' is input several times between input periods of the auto-refresh command 'aref'. When the number of times the read command 'rd' is input reaches a predetermined number, the counting unit 120 enables the determination signal 'dtm'. The latch unit 130 then enables the update control signal 'upctrl' by latching the determination signal 'dtm' at the next input timing of the auto refresh command 'aref'.

In the exemplary diagram of FIG. 3B the first command 'cmd1' is represented as a power down command 'pwdn' and the second command "cmd2" is represented as a read command 'rd'. As shown in FIG. 3B, the semiconductor integrated circuit 1 enters the power down mode in the periods where the power down command 'pwdn' is enabled and the semiconductor integrated circuit 1 exits the power down mode when the power down command 'pwdn' is disabled. Similar to FIG. 3A, the operation for determining the number of times the read command 'rd' is input between input periods of the power down command 'pwdn' and subsequently enabling the determination signal 'dtm' and the update control signal 'upctrl' are performed in the same manner as described with reference to FIG. 3A.

Figure 4:
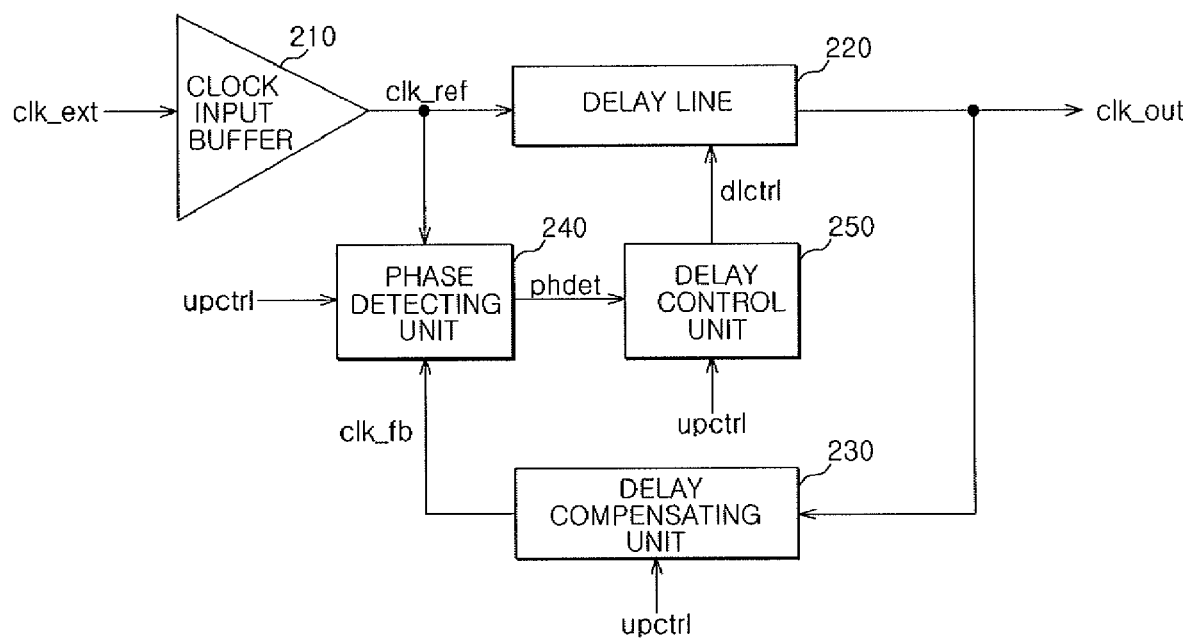
FIG. 4 is a diagram showing a configuration of the DLL circuit shown in FIG. 1.

FIG. 4 is a diagram showing a configuration of the DLL circuit 20 shown in FIG. 1.

As shown in FIG. 4, the DLL circuit 20 can include a clock input buffer 210, a delay line 220, a delay compensating unit 230, a phase detecting unit 240, and a delay control unit 250.

The clock input buffer 210 generates a reference clock 'clk_ref' by buffering the external clock 'clk_ext'. The delay line 220 generates the output clock 'clk_out' by delaying the reference clock 'clk_ref' in response to a delay control signal 'dlctrl'. The delay compensating unit 230 generates a feedback clock 'clk_fb' by applying a predetermined delay time to the output clock 'clk_out' in response to the update control signal 'upctrl'. The phase detecting unit 240 generates a phase detection signal 'phdet' by comparing the phase of the reference clock 'clk_ref' with the phase of the feedback clock 'clk_fb' in response to the update control signal 'upctrl'. The delay control unit 250 generates a delay control signal 'dlctrl' having a logic value controlled by the phase detection signal 'phdet' in response to the update control signal 'upctrl'.

In this configuration, the delay compensating unit 230 is implemented using a replica delayer and has a delay value modeling the delay amount of the delay elements existing along the path of the output clock 'clk_out' that is transmitted to a data output circuit.

According to the configuration of the DLL circuit 20 as described above, the delay compensating unit 230, the phase detecting unit 240, and the delay control unit 250 are components implementing the update operation of the DLL circuit 20. Thus, when the update control signal 'upctrl' is enabled, the delay compensating unit 230, the phase detecting unit 240, and the delay control unit 250 perform normal operations such that the phase of the output clock 'clk_out' is finely controlled. Alternatively, when the update control signal 'upctrl' is disabled, the delay compensating unit 230, the phase detecting unit 240, and the delay control unit 250 stop the operations. At which point, the delay control signal 'dlctrl' has a locked-delay value. Accordingly, the delay line 220 performs an operation of applying a locked-delay time to the reference clock 'clk_ref'.

That is, the DLL circuit 20 performs an operation of finely controlling the phase of the output clock 'clk_out' during periods where a data output circuit frequently requires the output clock "clk_out", and reduces power consumption by not updating the delay amount when generating the output clock 'clk_out' during periods where the data output circuit intermittently requires the output clock 'clk_out'.

Depending on the implementation of the above configuration, any one of the delay compensating unit 230, the phase detecting unit 240, and the delay control unit 250 can be operated in response to the update control signal 'upctrl'. Alternatively, only two components of the delay compensating unit 230, the phase detecting unit 240, and the delay control unit 250 can operate in response to the update control signal 'upctrl'. That is, the DLL circuit 20 has a configuration allowing the update operation to be performed or stopped in response to the update control signal 'upctrl' in which the component controlling the update operation can be modified in various ways.

Conventional semiconductor integrated circuits are configured to always update DLL circuits except for in the power down mode. As a result, power is unnecessarily wasted. However, a semiconductor integrated circuit and a method of controlling the semiconductor integrated circuit according to an embodiment of the present invention, as described above in detail, counts the number of times a second command is input after inputting a first command. The semiconductor integrated circuit according to an embodiment of the present invention disables an update control signal when the number of times the second command is input is less than a predetermined number of times. Further, an update operation of a DLL circuit is stopped when the update control signal is disabled. Accordingly, in a pseudo power down mode where a read operation is intermittently performed, the DLL circuit does not perform the update operation. As a result, the power consumed by the DLL circuit is reduced. Therefore, by implementing the above embodiment of the present invention, it is possible to improve the overall power efficiency of the semiconductor integrated circuit and provide a semiconductor integrated circuit requiring less power.

While certain embodiments have been described above, it will be understood that the embodiments described are by way of example only. Accordingly, the device and method described herein should not be limited based on the described embodiments. Rather, the devices and methods described herein should only be limited in light of the claims that follow when taken in conjunction with the above description and accompanying drawings.

What is claimed is:

1. A semiconductor integrated circuit, comprising:
    an update control unit configured to generate an update control signal in response to the number of times a second command is input during every period between input timings of a first command; and
    a DLL (Delay Locked Loop) circuit configured to generate an output clock by controlling a phase of an external clock in response to the update control signal.

2. The semiconductor integrated circuit according to claim 1, wherein the update control unit is configured to enable the update control signal when the number of times the second command is input reaches a predetermined number of times, and disable the update control signal when the number of times the second command is input is less than the predetermined number of times.

3. The semiconductor integrated circuit according to claim 2, wherein the first command is an auto-refresh command and the second command is a read command.

4. The semiconductor integrated circuit according to claim 2, wherein the first command is a power down command and the second command is a read command.

5. The semiconductor integrated circuit according to claim 2, wherein the update control unit includes:
    a delay unit configured to generate a delay command by delaying the first command;
    a counting unit configured to be reset according to input of the delay command and generate a determination signal by performing a counting operation in response to input of the second command; and
    a latch unit configured to latch the determination signal in response to the first command and output the update control signal.

6. The semiconductor integrated circuit according to claim 1, wherein the DLL circuit is configured to update a delay amount with respect to the external clock when the update control signal is enabled, and generate the output clock by applying a locked delay amount to the external clock when the update control signal is disabled.

7. The semiconductor integrated circuit according to claim 6, wherein the DLL circuit includes:
    a clock input buffer configured to generate a reference clock by buffering the external clock;
    a delay line configured to generate the output clock by delaying the reference clock in response to a delay control signal;

a delay compensating unit configured to generate a feedback clock by applying a predetermined delay time to the output clock in response to the update control signal;

a phase detecting unit configured to generate a phase detection signal by comparing a phase of the reference clock with a phase of the feedback clock in response to the update control signal; and a delay control unit configured to generate the delay control signal having a logic value, which is controlled by the phase detection signal, in response to the update control signal.

8. A semiconductor integrated circuit comprising:

a DLL (Delay Locked Loop) circuit configured to generate an output clock by controlling a phase of an external clock; and an update control unit configured to control whether to update the DLL circuit by distinguishing a pseudo power down mode based on the frequency of which a read operation is performed.

9. The semiconductor integrated circuit according to claim 8, wherein the DLL circuit is configured to activate or deactivate components for performing an update operation according to control of the update control unit.

10. The semiconductor integrated circuit according to claim 9, where in the DLL circuit includes:

a clock input buffer configured to generate a reference clock by buffering the external clock;

a delay line configured to generate the output clock by delaying the reference clock in response to a delay control signal;

a delay compensating unit configured to generate a feedback clock by applying a predetermined delay time to the output clock in response to the update control signal;

a phase detecting unit configured to generate a phase detection signal by comparing a phase of the reference clock with a phase of the feedback clock in response to the update control signal; and a delay control unit configured to generate the delay control signal having a logic value, which is controlled by the phase detection signal, in response to the update control signal.

11. The semiconductor integrated circuit according to claim 8, wherein the update control unit is configured to distinguish the pseudo power down mode by determining a number of a read commands input with respect to an auto-refresh command or a power down command.

12. The semiconductor integrated circuit according to claim 11, wherein the update control unit includes:

a delay unit configured to generate a delay command by delaying the auto-refresh command or the power down command;

a counting unit configured to be reset according to input of the delay command and generate a determination signal by performing a counting operation in response to input of the read command; and a latch unit configured to latch the determination signal in response to the auto-refresh command or the power down command, and to output an update control signal.

13. A method of controlling a semiconductor integrated circuit, comprising:

counting a number of times a second command is input after a first command is input;

generating an update control signal according to a result of the counting; and controlling an update operation of a DLL (Delay Locked Loop) circuit in response to the update control signal.

14. The method of controlling a semiconductor integrated circuit according to claim 13, wherein the step of counting the number of times a second command is input comprises initiating the counting operation when the first command is subsequently input.

15. The method of controlling a semiconductor integrated circuit according to 13, wherein the step of generating the update control signal includes:

generating a determination signal by determining the number of times the second command is input after the first command is input; and generating the update control signal by latching the determination signal when the first command is subsequently input.

16. The method of controlling a semiconductor integrated circuit according to 13, wherein the step of controlling the update operation of the DLL circuit comprises deactivating components for performing the update operation among components of the DLL circuit such that the DLL circuit has a locked delay amount.

17. The method of controlling a semiconductor integrated circuit according to 13, wherein the step of generating the update control signal comprises enabling the update enable signal when the number of times the second command is input reaches a predetermined number of times, and the step of controlling the update operation of the DLL circuit comprises updating a delay value of the DLL circuit by activating components for performing the update operation among components of the DLL circuit when the update enable signal is enabled.

18. The method of controlling a semiconductor integrated circuit according to 13, wherein the first command is an auto-refresh command and the second command is a read command.

19. The method of controlling a semiconductor integrated circuit according to 13, wherein the first command is a power down command and the second command is a read command.

20. A semiconductor integrated circuit, comprising:

an update control unit configured to generate an update control signal in response to a first command and a second command; and a DLL (Delay Locked Loop) circuit configured to update a delay amount with respect to a external clock when the update control signal is enabled, and generate a output clock by applying a locked delay amount to the external clock when the update control signal is disabled.

21. The semiconductor integrated circuit according to claim 20, wherein the update control unit is configured to determine the number of times the second command is input during every period between input timings of the first command, enable the update control signal when the number of times the second command is input reaches a predetermined number of times, and disable the update control signal when the number of times the second command is input is less than the predetermined number of times.

22. The semiconductor integrated circuit according to claim 21, wherein the first command is an auto-refresh command and the second command is a read command.

23. The semiconductor integrated circuit according to claim 21, wherein the first command is a power down command and the second command is a read command.

24. The semiconductor integrated circuit according to claim 21, wherein the update control unit includes:

a delay unit configured to generate a delay command by delaying the first command;

a counting unit configured to be reset according to input of the delay command and generate a determination signal by performing a counting operation in response to input of the second command; and a latch unit configured to latch the determination signal in response to the first command and output the update control signal.

25. The semiconductor integrated circuit according to claim 20, wherein the DLL circuit includes:

a clock input buffer configured to generate a reference clock by buffering the external clock;

a delay line configured to generate the output clock by delaying the reference clock in response to a delay control signal;

a delay compensating unit configured to generate a feedback clock by applying a predetermined delay time to the output clock in response to the update control signal;

a phase detecting unit configured to generate a phase detection signal by comparing a phase of the reference clock with a phase of the feedback clock in response to the update control signal; and a delay control unit configured to generate the delay control signal having a logic value, which is controlled by the phase detection signal, in response to the update control signal.

* * * * *